United States Patent
Wallis

(10) Patent No.: US 10,367,536 B2
(45) Date of Patent: *Jul. 30, 2019

(54) AGGREGATE SIGNAL AMPLIFICATION DEVICE AND METHOD

(71) Applicant: Skyworks Solutions, Inc., Woburn, MA (US)

(72) Inventor: Leslie Paul Wallis, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/056,200

(22) Filed: Aug. 6, 2018

(65) Prior Publication Data

US 2019/0028132 A1 Jan. 24, 2019

Related U.S. Application Data

(63) Continuation of application No. 15/700,420, filed on Sep. 11, 2017, now Pat. No. 10,069,527, which is a
(Continued)

(51) Int. Cl.
*H03F 3/19* (2006.01)
*H03F 3/21* (2006.01)
(Continued)

(52) U.S. Cl.
CPC .............. *H04B 1/109* (2013.01); *H03F 3/19* (2013.01); *H03F 3/193* (2013.01); *H03F 3/21* (2013.01);
(Continued)

(58) Field of Classification Search
CPC .... H04B 1/109; H04B 1/1027; H04B 1/1036; H04B 1/18; H04B 15/005; H03F 3/19;
(Continued)

(56) References Cited

U.S. PATENT DOCUMENTS 4,105,949 A 8/1978 Hardin
9,455,755 B2 * 9/2016 Wallis ..................... H03F 3/193
(Continued)

FOREIGN PATENT DOCUMENTS

CN 103780278 A 5/2014
CN 103907290 A 7/2014
(Continued)

OTHER PUBLICATIONS

International Search Reported dated May 19, 2017 for Taiwanese Patent Application No. 1 04122805, 1 page.

*Primary Examiner* — Nguyen T Vo
(74) *Attorney, Agent, or Firm* — Knobbe, Martens, Olson & Bear, LLP

(57) ABSTRACT

A surface acoustic wave (SAW) filter that receives an aggregate circuit and outputs two or more sub-signals on outputs each of a different frequency band. The sub-signals are amplified by low noise amplifiers and, in one implementation, the amplified sub-signals can be summed. The outputs are connected via a switched passive network so that portions of the sub-signals on the outputs that are not in the selected frequency band are at least partially terminated.

20 Claims, 8 Drawing Sheets

Related U.S. Application Data continuation of application No. 15/254,257, filed on Sep. 1, 2016, now Pat. No. 9,768,813, which is a continuation of application No. 14/717,978, filed on May 20, 2015, now Pat. No. 9,455,755.

(60) Provisional application No. 62/060,488, filed on Oct. 6, 2014.

(51) Int. Cl.
| | | |
|---|---|---|
| *H04B 1/10* | (2006.01) | |
| *H04B 1/18* | (2006.01) | |
| *H03F 3/193* | (2006.01) | |
| *H04B 15/00* | (2006.01) | |
| *H04W 52/52* | (2009.01) | |

(52) U.S. Cl.
CPC ........... *H03F 3/211* (2013.01); *H04B 1/1027* (2013.01); *H04B 1/1036* (2013.01); *H04B 1/18* (2013.01); *H04B 15/005* (2013.01); *H04W 52/52* (2013.01); *H03F 2200/451* (2013.01); *H03F 2203/21109* (2013.01); *H03F 2203/21112* (2013.01); *H04B 2001/1054* (2013.01)

(58) Field of Classification Search
CPC . H03F 3/193; H03F 3/21; H03F 3/211; H03F 2200/451; H03F 2203/21109; H03F 2203/21112; H04W 52/52
See application file for complete search history.

(56) References Cited

U.S. PATENT DOCUMENTS

| | | | |
|---|---|---|---|
| 9,768,813 B2 * | 9/2017 | Wallis | ..................... H03F 3/193 |
| 10,069,527 B2 * | 9/2018 | Wallis | ..................... H03F 3/193 |
| 2009/0109880 A1 | 4/2009 | Kim | |
| 2010/0304693 A1 | 12/2010 | Uejima | |
| 2013/0043946 A1 | 2/2013 | Hadjichristos | |
| 2013/0241666 A1 | 9/2013 | Granger-Jones | |
| 2014/0003300 A1 | 1/2014 | Weissman | |
| 2015/0257022 A1 | 9/2015 | Kohlmann | |
| 2015/0295594 A1 | 10/2015 | Kehrer | |
| 2015/0333949 A1 | 11/2015 | Tasic | |
| 2016/0020862 A1 | 1/2016 | Morshedi | |
| 2018/0097533 A1 | 4/2018 | Wallis | |

FOREIGN PATENT DOCUMENTS

| | | |
|---|---|---|
| JP | 2011-97557 A | 5/2011 |
| JP | 2014-522216 A | 8/2014 |
| JP | 2015-115929 A | 6/2015 |
| TW | 201340664 A | 10/2013 |
| TW | 201401907 A | 1/2014 |
| WO | WO 2013/131047 A1 | 9/2013 |
| WO | WO 2016/010848 A1 | 1/2016 |

\* cited by examiner

AGGREGATE SIGNAL AMPLIFICATION DEVICE AND METHOD

BACKGROUND

Field of the Invention

Embodiments of the invention relate to electronic systems and, in particular, to radio frequency (RF) electronics.

Description of the Related Art

RF electronics, such as cell phones, smart phones, tablets, computers, modems and other devices operate on a limited frequency spectrum. Various schemes are implemented to permit multiple devices to be transmitting and receiving on a particular frequency bands simultaneously. One such scheme is called carrier or channel aggregation which is currently used in 4G LTE Advanced implementations. In this scheme, wider transmission bandwidths are used to simultaneously transmit aggregated component carriers where the component carriers have different frequencies.

The component carriers can either be contiguous or non-contiguous frequencies. When multiple component carriers in different bands are aggregated and transmitted, they must be received using multiple bandpass filters, one for each band received. Such filters may be entirely independent from one another, or, coupled together at a common input point, such as at a common antenna.

Within the wireless receiving device, often the outputs of such filters must be amplified and re-combined onto a single path. An example of where this is done in a wireless device is the "diversity" receiver.

However, amplification and combining of these types of signals can result in significant noise and gain differences for signals among the different received frequency bands, which can affect overall signal quality. Hence, there is a need for an improved system and method of amplifying aggregated carrier component signals with reduced noise and improved gain characteristics.

SUMMARY

Certain embodiments disclosed herein provide a device for amplifying aggregate signals comprising: at least one filter that receives an aggregate signal having a plurality of signal components of different frequency bands and separates the aggregate signal into a plurality of sub-signals of different frequency bands onto a plurality of outputs; a plurality of amplifiers that receive the plurality of sub-signals from the plurality of different outputs and amplify the plurality of sub-signals; and a network interposed between the plurality of outputs, the network having components selected to terminate at least a portion of the signals on the plurality of outputs that have a frequency outside of the frequency band corresponding to the output.

In one implementation the filter includes a surface acoustic wave (SAW) filter.

In one implementation, the surface acoustic wave (SAW) filter receives a diplex signal and outputs two signals onto two outputs that have different frequencies.

In another implementation the at least one filter includes a plurality of filters.

In another implementation, the plurality of amplifiers include low noise amplifiers formed of field effect transistors or bipolar junction transistors.

In one implementation the device further comprises a summing component that sums the amplified sub-signals.

In one implementation, the summing component includes a common node that receives the amplified sub-signals.

In one implementation, the network includes a passive network.

In one implementation, the passive network includes a resistor in parallel with an inductor.

In one implementation, the network includes at least one switch so that the passive network is selectively coupled between the plurality of outputs when sub-signals are being provided to the plurality of outputs and is selectively disengaged when only a single output signal is being provided to one of the plurality of outputs.

In one implementation, the at least one switch includes a plurality of switches that are respectively coupled to the plurality of outputs.

Certain embodiments disclosed herein provide a wireless device comprising: a receiver that receives wireless signals; a processor that controls the operation of the wireless device; at least one filter that receives an aggregate signal having a plurality of signal components of different frequency bands and separates the aggregate signal into a plurality of sub-signals of different frequency bands onto a plurality of outputs; a plurality of amplifiers that receive the plurality of sub-signals from the plurality of different outputs and amplify the plurality of sub-signals; and a network interposed between the plurality of outputs, the network having components selected to terminate at least a portion of the signals on the plurality of outputs that have a frequency outside of the frequency band corresponding to the output.

In one implementation, the filter includes a surface acoustic wave (SAW) filter.

In one implementation, the surface acoustic wave (SAW) filter receives a diplex signal and outputs two signals onto two outputs that have different frequencies.

In one implementation, the at least one filter includes a plurality of filters.

In one implementation, the plurality of amplifiers include low noise amplifiers formed of field effect transistors or bipolar junction transistors.

In one implementation, the device further comprises a summing component that sums the amplified sub-signals.

In one implementation, the summing component includes a common node that receives the amplified sub-signals.

In one implementation, the network includes a passive network.

In one implementation the passive network includes a resistor in parallel with an inductor.

In one implementation, the network includes at least one switch so that the passive network is selectively coupled between the plurality of outputs when sub-signals are being provided to the plurality of outputs and is selectively disengaged when only a single output signal is being provided to one of the plurality of outputs.

In one implementation, the at least one switch includes a plurality of switches that are respectively coupled to the plurality of outputs.

In one implementation, the device includes a plurality of filters that receive aggregate signals.

Certain embodiments disclosed herein disclose a method of amplifying aggregate signals comprising: separating onto outputs aggregate signals having a plurality of signal components of different frequency bands into sub-signals of pre-selected frequency bands; amplifying the sub-signals; and interconnecting the outputs via an impedance network, the impedance network being selected so as to at least partially terminate portions of a sub-signal on an output having a frequency other than the pre-selected frequency band.

In one implementation, separating the aggregate signals includes separating the signals using a multiplex surface acoustic wave (SAW) filter.

In one implementation, amplifying the sub-signals includes amplifying the sub-signals using a low noise amplifier.

In one implementation, interconnecting the outputs via an impedance networks includes interconnecting the outputs via switches and a passive network.

In one implementation, the passive network includes a resistor in parallel with an inductor.

In one implementation, the method further comprises summing the amplified sub-signals.

In one implementation, separating the aggregate signals includes separating the signals using a plurality of filters to produce a plurality of sub-signals.

DETAILED DESCRIPTION OF THE PREFERRED EMBODIMENT

Figure 1:
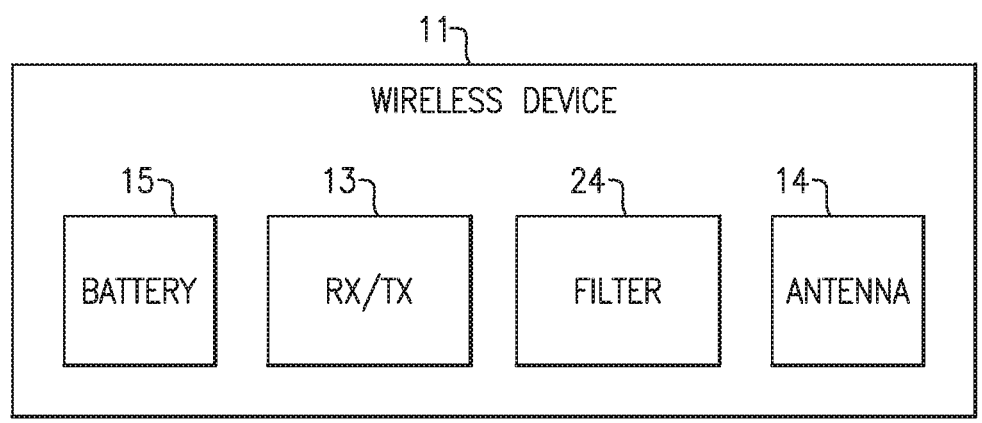
FIG. 1 is a schematic diagram of a wireless device having a receiver having a filtering component of the present disclosure.

FIG. 1 is a schematic diagram of a wireless device 11 such as a cellular phone, smart phone, tablet, modem, communication network or any other portable or non-portable device configured for voice and/or data communication.

The device 11 includes an antenna 14 that receives signals such as multiplex signal and a filter component 24 that in one specific implementation derives component signals from a multiplex signal. However, as will be discussed below, the filter component 24 may comprise any of a number of different filter implementations. The component further includes a transceiver 13 that can be configured to receive and transmit signals in a known fashion and a battery 15 that provides power to the device 11.

Figure 2:
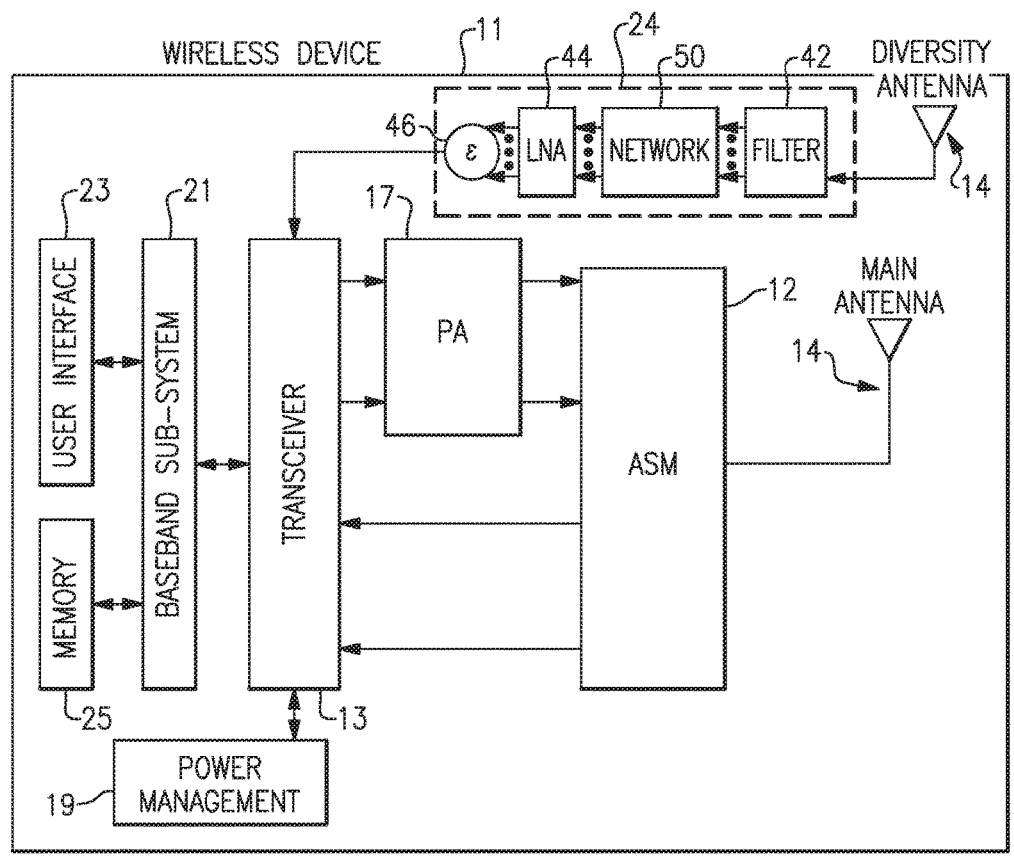
FIG. 2 is a schematic block diagram of an example wireless or network device that can include one or more of the modules of FIG. 1.

FIG. 2 illustrates the wireless device 11 in greater detail. As shown, the device 11 may receive signals from a plurality of antennas 14 including a main antenna, a diversity antenna and the like. The main antenna 14 may be selected via an antenna switch module 12 so that signals can be selectively transmitted and received. The antenna switch module 12 receives signals from the transceiver 13 via a power amplifier module 17. The transceiver 13 is configured to generate transmit signals and/or process received signals.

In some embodiments, such transmission and reception functionalities can be implemented in separate components (e.g. a transmit module and a receiving module), or be implemented in the same module. The antenna switch module 12 can be configured to switch between different bands and/or modes, transmit and receive modes etc. As is also shown in FIG. 2, the main antenna 14 both receives signals that are provided to the transceiver 13 via the antenna switch module 12 and also transmit signals from the wireless device 11 via the transceiver 13, the power amplifiers 17 and the antenna switch module 12 in a known fashion.

The system of FIG. 2 further includes a power management system 19 that is connected to the transceiver 13 that manages the power for the operation of the wireless device. The power management system 19 can also control the operation of a baseband sub-system 21 and other components of the wireless device 11. The power management system 19 provides power to the device 11 via the battery 15 in a known manner.

The baseband sub-system 21 is shown to be connected to a user interface 23 to facilitate various input and output of voice and/or data provided to and received from the user. The baseband sub-system 21 can also be connected to memory 25 that is configured to store data and/or instructions to facilitate the operation of the wireless device, and/or to provide storage of information for the user.

The power amplifiers 17 can be used to amplify a wide variety of RF signals. For example, one or more of the power amplifiers 17 can receive an enable signal that can be used to pulse the output of the power amplifier to aid in transmitting a wireless local area network (WLAN) signal or any other suitable pulsed signal.

Each of the power amplifiers 17 need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, or an EDGE signal.

In certain embodiments, a processor can be configured to facilitate implementation of various processes described herein. For the purpose of description, embodiments of the present disclosure may also be described with reference to flowchart illustrations and/or block diagrams of methods, apparatus (systems) and computer program products.

It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 29 that can direct a computer or other programmable data processing apparatus to operate in a particular manner, such that the instructions stored in the computer-readable memory produce an article of manufacture including instruction means which implement the acts specified in the flowchart and/or block diagram block or blocks.

The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

As is also shown in FIG. 2, the wireless device 11 can also include a filter and amplifier element 24 that is adapted in one specific instance to receive a first input signal and filter the signal into one or more output signals and amplify the output signals.

In one specific implementation, the filter and amplifier element 24 receives an aggregate carrier or channel signals that comprise component signals transmitted on a bandwidth. The element 24 may be part of the RF front end or may be interposed between the RF front end and the transceiver 13. Regardless, the element 24 receives, in one implementation, a multiplex signal such as a diplex signal that is comprised of more than one frequency band where the signals are aggregated. This allows for greater transmission of data and signals. Often, the signals will need to be amplified prior to the signals being used. The implementation shown in FIG. 2 is simply exemplary and should be non-limiting.

More specifically, as shown in FIG. 2 the wireless device 11 may include the element 24 that receives signals from an antenna 14. The element 24 includes a filter 42 such as a multiplex filter that receives an aggregate signal that comprises a plurality of signal components. The filter 42 then separates the aggregate signals into the signal components on different frequency bands and provides this to low noise amplifiers 44 via a network 50 that is preferably switchable.

As will be described in greater detail below, the network 50 is designed to terminate or at least attenuate portions of the component signals that fall outside of the frequency band of the component signals to reduce noise and improve signal performance. The output of the amplifiers 44 can then be provided directly to the transceiver 13 or can be summed via a summing component 46.

It should be noted that in FIG. 2, the element 24 is receiving the signal from a diversity antenna 14. However, the element 24 can also receive signals from a main antenna 14 or can be implemented in any of a number of different manners without departing from the present teachings.

Figure 3:
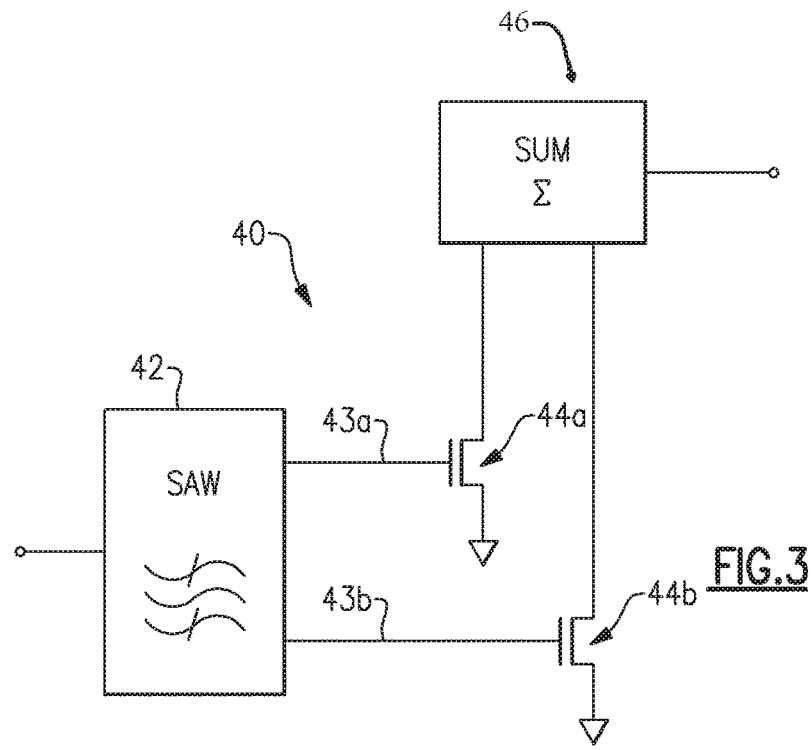
FIG. 3 is a circuit diagram of a diplexing filter and amplifier circuit that can be used with the low-noise amplifier module of FIG. 1.
Figure 4:
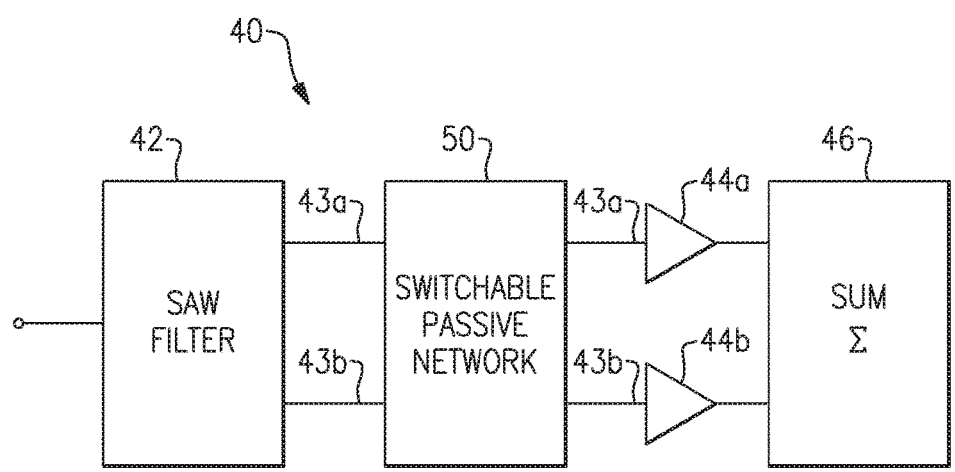
FIG. 4 is a schematic block diagram of a diplexing filter and amplifier circuit with a switchable passive network that can be used with the low-noise amplifier module of FIG. 1.

FIG. 3 is an exemplary circuit 40 of an amplifier circuit 40 for an aggregated signal. As shown, the circuit 40 includes a filter 42, e.g., a diplex filter that receives the multiplex signal from, for example, the antenna 14. The diplex filter 42 can comprise, in one non-limiting implementation, a surface acoustic wave (SAW) filter that receives the diplex signal and outputs two separate signals on two separate frequency bands on outputs 43a, 43b. The outputs are then fed into the gate of a low noise amplifying transistor 44a, 44b which results in an amplified signal that can then be either provided directly to another circuit component or the amplified signals can be provided to a summing circuit or amplifier 46. The summing circuit 46 can then provide a summed output signal.

In one exemplary implementation, the low noise amplifying transistors 44a, 44b are depicted as FET-type transistors. It will be appreciated, however, that the application should not be limited to simply FET-type transistors as any of a number of different types of amplifying devices can be used without departing from the scope of the present disclosure. For example, bipolar junction transistor applications can also be used without departing from the scope of the present teachings.

In one implementation, the summing circuit 46 comprises a common node that receives the signals from the transistors 44a, 44b but other implementations are also possible without departing from the scope of the present invention. The multiplex filter 42 can be receiving the input signal from the antenna 14 or from the RF front end 12 or any other component and the summing circuit 46 can be providing the amplified signal to the RF front end 12, to the antenna 14 or any other component depending upon the implementation. Again, a person of ordinary skill in the art will appreciate that the component can be implemented in any of a variety of different configurations of a wireless device.

One difficulty that occurs with the circuit of FIG. 3 is that there can be substantial noise and difference gain on each of the frequency bands of the output of the multiplex filter 42. This occurs as a result of the signals on one band back coupling to the low noise amplifier inputs 44a, 44b and reflecting at the multiplex signal filter 42 in the aggregated band. This occurs because, at frequencies other than the intended pass bands of the multiplex filter 42, the filter 42 outputs are highly reflective which results in significant gain variation.

Further, the low noise amplifiers will only give low noise figures when the source impedance is correctly matched. If the input of the low noise amplifiers 44a, 44b are presented with a very reflective source impedance in the aggregate frequency bands, the output noise of the low noise amplifier 44a, 44b can be very high which degrades circuit performance.

In order to address these issues, a switchable network 50, such as a passive network, can be implemented between the multiplex filter 42 and the low noise amplifiers 44a, 44b. The switchable network 50 is preferably tuned so that the network 50 provides for mutual termination of the portion of the signal that is being reflected. In other words, the portion of the signal on each of the outputs 43a, 43b that has a frequency component that falls outside of the band for the output 43a, 43b is preferably terminated or attenuated by the network 50.

The switchable network 50 can comprise a network of passive components, such as resistors, capacitors and inductors and can also include shunts etc. or even in some implementations active devices. The network 50 is preferably tuned so that the portion of a signal on one of the outputs 43 that is not the correct frequency band for that output 43a, 43b is terminated or at least attenuated by the network 50.

Preferably, the network 50 is switchable such that the network can be selectively connected and disconnected between the two outputs 43. This permits the use of either output 43 when a non-aggregate signal is being passed by the filter 42 with the losses introduced by the network 50 reduced as a result of the network being switched out of the circuit. However, when the filter 42 is passing an aggregate signal on one or more of the outputs 43, the passive network 50 can be switched between the two outputs 43 thereby allowing the termination of the portion of the signals on the outputs that would otherwise cause noise and gain inconsistencies.

Figure 5:
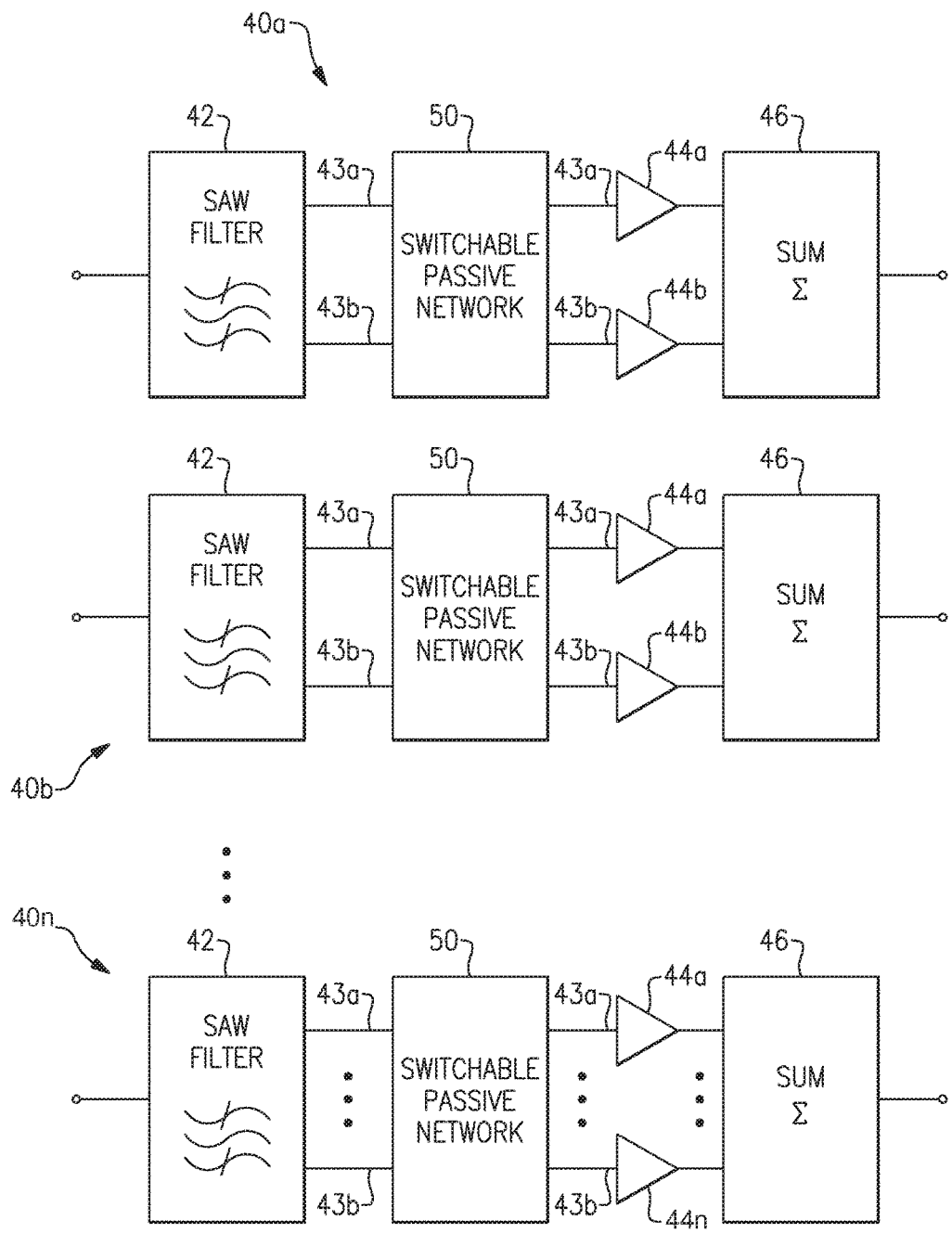
FIG. 5 is a schematic block diagram of an array of diplexing filters and amplifier circuits of FIG. 4.

FIG. 5 is another implementation of the filter component 24 shown in FIG. 2. As illustrated, the filter component 24 can actually comprise a plurality of circuits components 40 each comprising a multiplex filter 42, a switchable passive network 50, amplifiers 44a, 44b and summing components 46. Further, the plurality of multiplex filters 42 may also comprise multiplex filters 42 that a diplex filters or filters that receive aggregate signals having more than two different discrete bands as demonstrated by the bottom most filter 40n.

Any other filter or set of filters that have multiple outputs can also be used without departing from the spirit of the present teachings. Preferably, there is a switching network 50n that has multiple passive components such that the unwanted signal components on each of the outputs 43 can be terminated in the manner described above and the outputs can be provided to multiple transistors 44a-44n. The exact configuration of the filter component 24 can vary depending upon the implementation.

Figure 6:
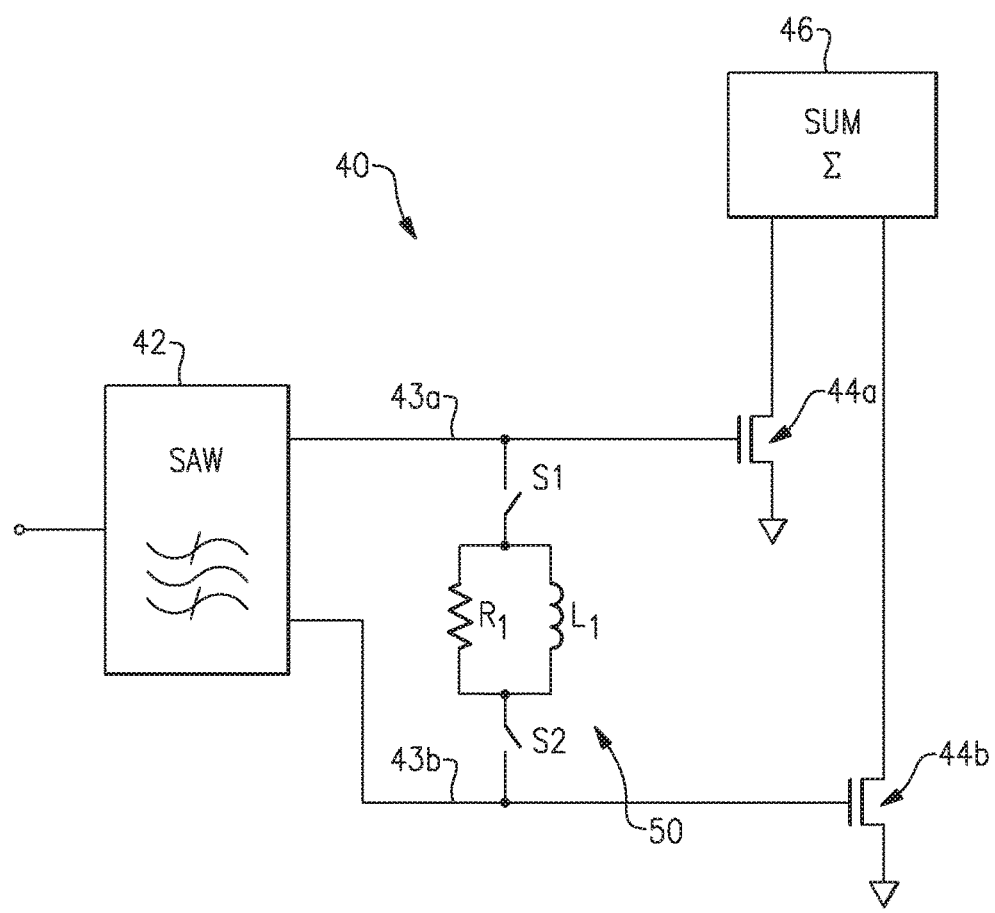
FIG. 6 is a circuit diagram of one implementation of a diplexing filter and amplifier circuit with a switchable passive network.

FIG. 6 is a specific exemplary circuit implementation of a filter component 40 that includes a SAW filter 42 having two outputs 43a, 43b that drive the gate of transistors 44a, 44b that function as low noise amplifiers. The drains of the transistors 44a, 44b are provided to a summing circuit 46 which, as discussed above, can comprise a common node that is connected to each transistor 44a, 44b.

In this implementation, the switching passive network 50 comprises a resistor R1 in parallel with an inductor L1 that is connected to the outputs 43a and 43b via switches that are controllable via the processor 20 or control 18 (See, FIG. 2). When an aggregate signal having two frequency bands is received by the SAW 42, the SAW 42 outputs discrete signals on the outputs 43a, 43b.

To amplify both signals, transistors 44a and 44b are both enabled. An undesired effect occurs where the signal of each band back-couples to the opposite-band low noise amplifier input, and reflects off the port of the opposite-band filter of the multiplex filter 42, thereby causing some signal power to be added or subtracted from the original signal. This results in significant gain variation. To correct this, the switches S1 and S2 are closed and the parallel resistor and inductor network terminates or reduces the unwanted reflected signal component.

Notably, the network does not substantially terminate the desired forward signal component, because the opposite end of the network is tied to the reflective impedance presented by the opposite-band filter port. Effectively the network appears as a tuning stub to the desired forward signal component. Therefore any excess loss of the desired signal is minimized. This results in a cleaner signal being provided to the amplifiers 44a, 44b and to the sum circuit component 46.

In circumstances where the SAW 42 is not providing an aggregate signal, the switches can be disabled so that the losses on the transmission of the non-aggregate signal to the low noise amplifiers 44a, 44b can be reduced.

Figure 7:
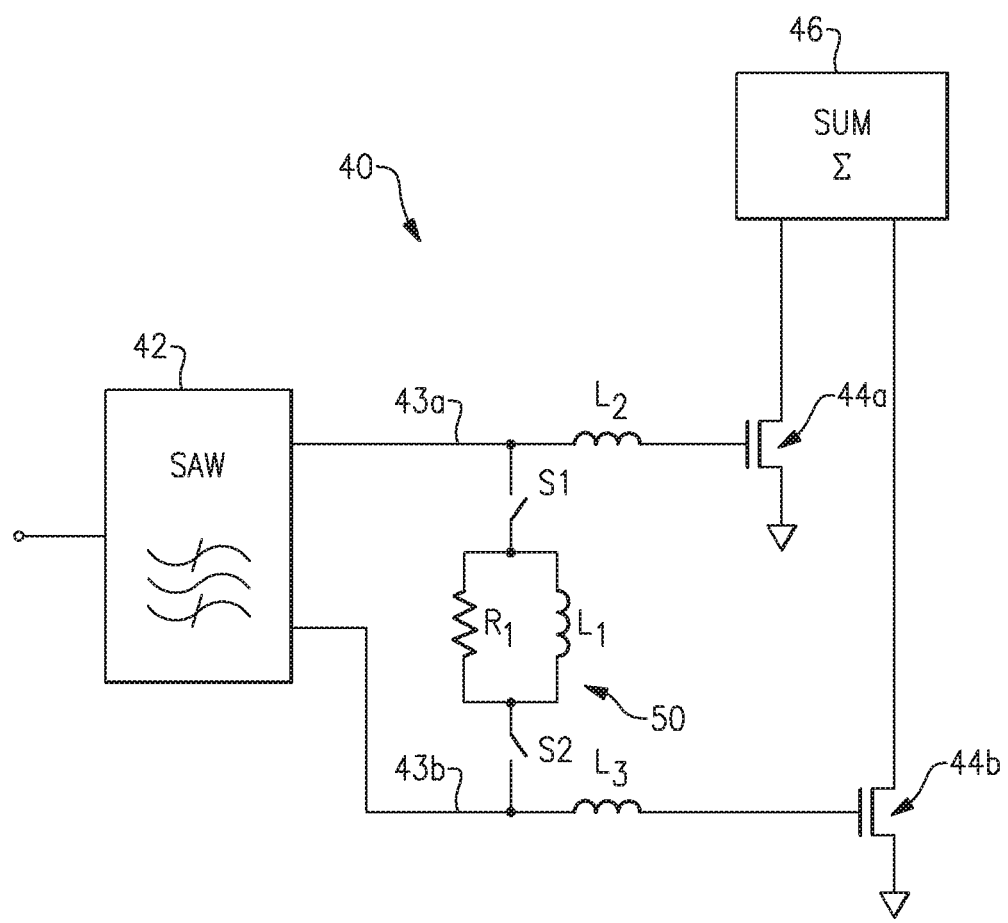
FIG. 7 is a circuit diagram of another implementation of a diplexing filter and amplifier circuit with a switchable passive network.
Figure 8:
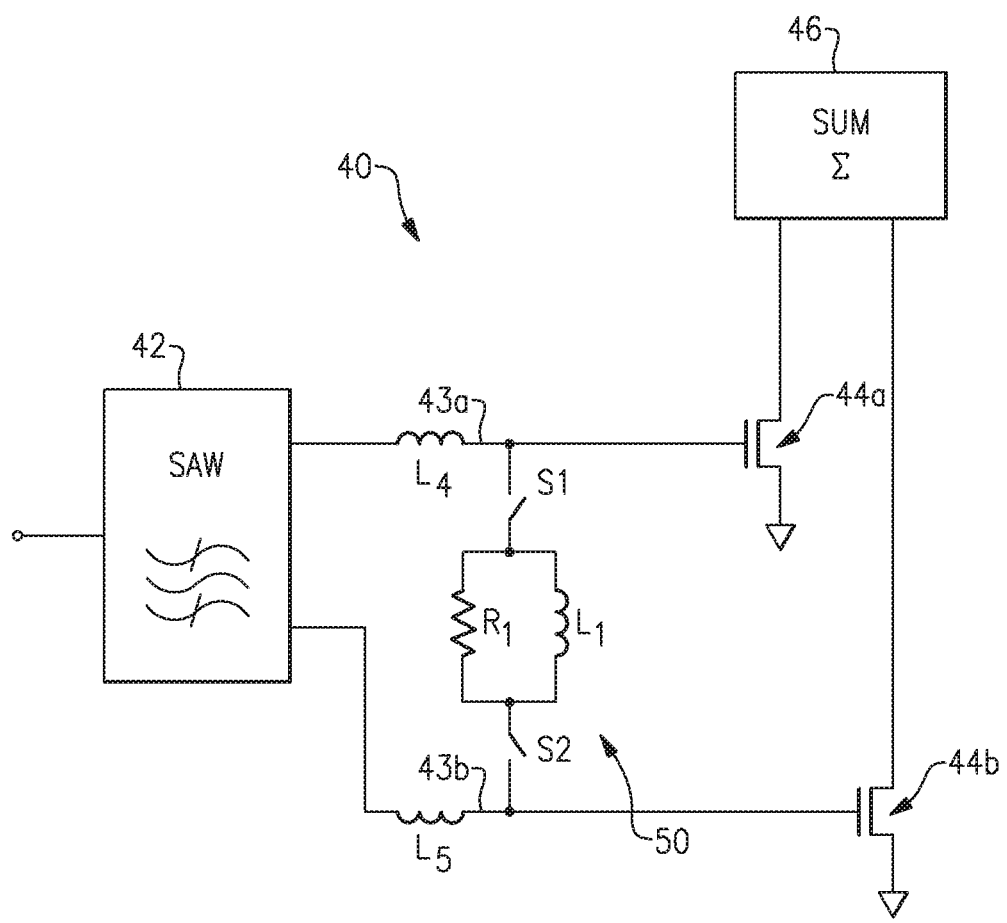
FIG. 8 is a circuit diagram of another implementation of a diplexing filter and amplifier circuit with a switchable passive network.

FIGS. 7 and 8 further illustrate other implementations. In the implementation of FIG. 7, an impedance match network comprising an inductor L2 and L3 may be added between the low noise amplifiers 44a, 44b and the switches S1 and S2 so as to provide the best possible noise figure for the amplifiers 44a, 44b. Similarly, in FIG. 8, inductors L4 and L5 can also be added between the switches S1 and S2 and the SAW 42 for the same purpose. The switched network 50 can thus be implemented either before or after the matching components that are selected to reduce the noise figure for the amplifiers 44a, 44b.

Figure 9:
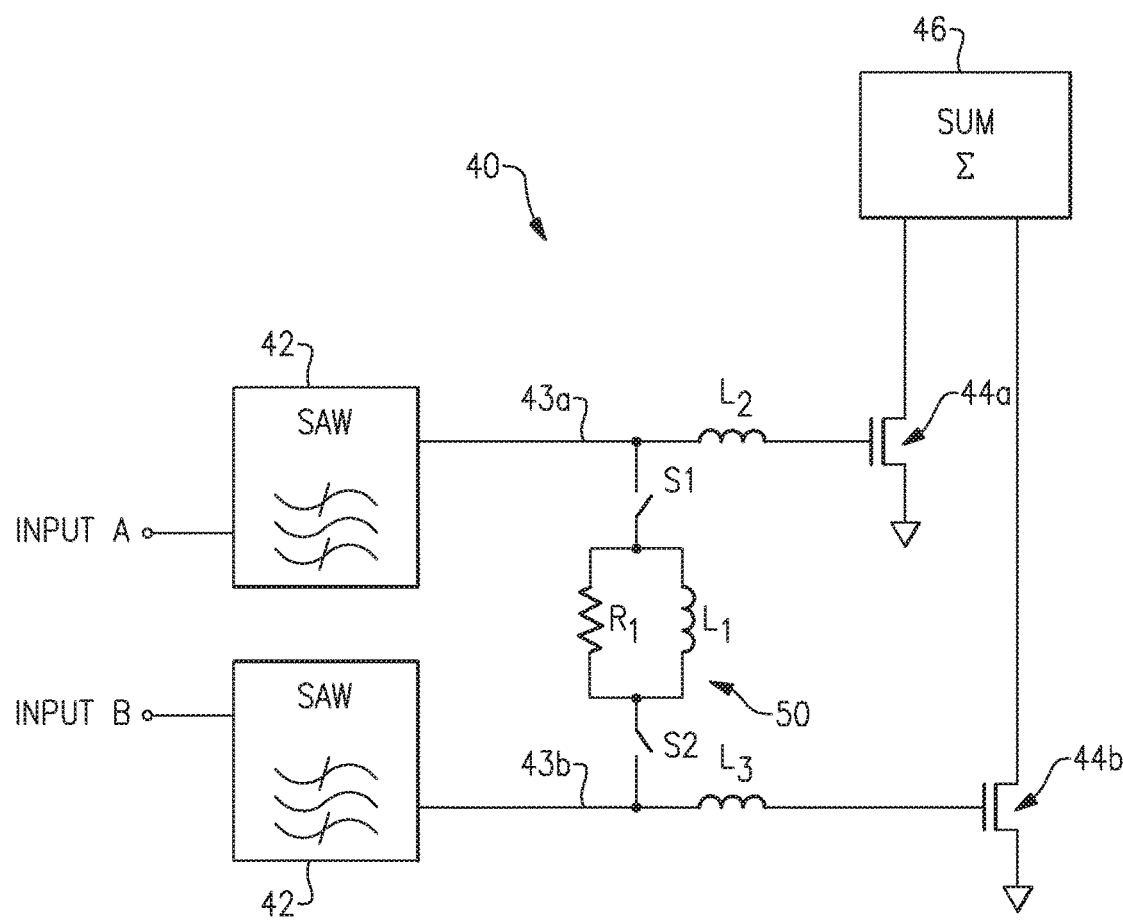
FIG. 9 is a circuit diagram of another implementation of a filter and amplifier circuit with a switchable passive network with a plurality of filters.

FIG. 9 illustrates that the noise and gain problems discussed above in conjunction with FIG. 3 may also be present if two entirely separate filters 42 are used. As shown in FIG. 9, two separate filters 42 provide outputs 43a, 43b and the outputs are connected via a switching network 50 in the same manner as described above. To the extent that there are components on one of the outputs 43a, 43b of the separate filters 42 that are not within the frequency band for the output 43a, 43b, the switchable network 50 can be used to terminate those unwanted signals to lower noise and improve gain difference between the outputs.

As preceding discussion has provided example implementations described in connection with SAW devices. However, it should be appreciated that any filter or set of filters, irrespective of construction, may present an unterminated impedance to the circuit out of their respective pass band. As such the output 43a, 43b may be receiving outputs of different types of filters and the unterminated impedances can similarly be terminated by an appropriately designed switchable network 50 within the scope of the present disclosure.

While the foregoing has shown, illustrated and described various implementations and uses of the present invention, a person of ordinary skill in the art will appreciate that various changes, substitutions and modifications to the embodiments described herein can be made by those skilled in the art without departing from the scope and spirit of the present invention. Hence, the present invention should not be limited to the foregoing descriptions but should be defined by the appended claims.

What is claimed is:

1. A device to amplify signals, the device comprising:
   at least one acoustic filter configured to receive a radio frequency signal and, when the radio frequency signal is an aggregate signal having a plurality of radio frequency sub-signals corresponding to different frequency bands, to (i) separate the received signal into the plurality of radio frequency sub-signals, and to (ii) output the plurality of radio frequency sub-signals onto a plurality of outputs;
   a network configured to engage with the plurality of outputs to at least partially terminate the plurality of radio frequency sub-signals when the received signal is an aggregate signal, and to disengage from the plurality of outputs when the received signal is other than an aggregate signal; and
   at least one amplifier in communication with at least one of the plurality of outputs.

2. The device of claim 1 wherein the at least one acoustic filter is a surface acoustic wave filter.

3. The device of claim 1 further comprising a summing component that sums amplified sub-signals.

4. The device of claim 1 wherein the received signal is one of an aggregate signal and a single frequency component signal.

5. The device of claim 4 wherein the at least one acoustic filter outputs the single frequency component signal onto the at least one of the plurality of outputs when the receive signal is the single frequency component signal.

6. The device of claim 1 wherein the network includes a resistor in parallel with an inductor.

7. The device of claim 1 wherein the network includes a passive network.

8. The device of claim 1 wherein the network includes at least one switch so that the network is selectively coupled between the plurality of outputs when the plurality of radio frequency sub-signals is being provided to the plurality of outputs and is selectively disengaged from the plurality of outputs when only a single output signal is being provided to the at least one of the plurality of outputs.

9. A wireless electronic device comprising:
an antenna configured to receive and transmit wireless signals;
a device including at least one acoustic filter configured to receive a radio frequency signal and, when the radio frequency signal is an aggregate signal having a plurality of radio frequency sub-signals corresponding to different frequency bands, to (i) separate the received signal into the plurality of radio frequency sub-signals, and to (ii) output the plurality of radio frequency sub-signals onto a plurality of outputs, a network configured to engage with the plurality of outputs to at least partially terminate the plurality of radio frequency sub-signals when the received signal is an aggregate signal, and to disengage from the plurality of outputs when the received signal is other than an aggregate signal, and at least one amplifier in communication with at least one of the plurality of outputs; and
a transceiver that processes an amplified signal.

10. The wireless electronic device of claim 9 wherein the at least one acoustic filter is a surface acoustic wave filter.

11. The wireless electronic device of claim 9 wherein the at least one acoustic filter is a multiplex surface acoustic wave filter.

12. The wireless electronic device of claim 9 wherein the received signal is one of an aggregate signal and a single frequency component signal.

13. The wireless electronic device of claim 12 wherein the at least one acoustic filter outputs the single frequency component signal onto the at least one of the plurality of outputs when the receive signal is the single frequency component signal.

14. A method to amplify aggregate signals, the method comprising:
receiving a radio frequency signal with at least one acoustic filter;
when the radio frequency signal is an aggregate signal having a plurality of radio frequency sub-signals corresponding to different frequency bands, separating, with the at least one acoustic filter, the received signal into the plurality of radio frequency sub-signals, and outputting the plurality of radio frequency sub-signals onto a plurality of outputs;
engaging a network with the plurality of outputs to at least partially terminate the plurality of radio frequency sub-signals when the received signal is an aggregate signal;
disengaging the network from the plurality of outputs when the received signal is other than an aggregate signal; and
amplifying the plurality of radio frequency sub-signals.

15. The method of claim 14 wherein the at least one acoustic filter is a surface acoustic wave filter.

16. The method of claim 14 wherein the at least one acoustic filter is a multiplex surface acoustic wave filter.

17. The method of claim 14 wherein engaging the network with the plurality of outputs includes connecting the plurality of outputs via at least one switch to a passive network.

18. The method of claim 17 wherein the network is a passive network tuned to provide mutual termination of reflected portions of the plurality of radio frequency sub-signals.

19. The method of claim 14 wherein the network includes a resistor in parallel with an inductor.

20. The method of claim 14 further comprising summing the amplified plurality of radio frequency sub-signals.

* * * * *